(12) United States Patent
Motika et al.

(10) Patent No.: US 7,908,534 B2
(45) Date of Patent: Mar. 15, 2011

(54) DIAGNOSABLE GENERAL PURPOSE TEST REGISTERS SCAN CHAIN DESIGN

(75) Inventors: Franco Motika, Hopewell Junction, NY (US); Michael R. Ouellette, Westford, VT (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 12/036,320

(22) Filed: Feb. 25, 2008

(65) Prior Publication Data

US 2009/0217116 A1     Aug. 27, 2009

(51) Int. Cl.
*G01R 31/28* (2006.01)

(52) U.S. Cl. .......................................... 714/729

(58) Field of Classification Search .................. 714/726, 714/727, 729
See application file for complete search history.

(56) References Cited

U.S. PATENT DOCUMENTS

| | | | |
|---|---|---|---|
| 3,761,695 A | 9/1973 | Eichelberger | |
| 5,150,366 A | 9/1992 | Bardell, Jr. et al. | |
| 5,504,756 A | 4/1996 | Kim et al. | |
| 5,881,067 A | 3/1999 | Narayanan et al. | |
| 5,982,189 A | 11/1999 | Motika et al. | |
| 6,125,465 A | 9/2000 | McNamara et al. | |
| 6,327,685 B1 | 12/2001 | Koprowski et al. | |
| 6,442,723 B1 | 8/2002 | Koprowski et al. | |
| 6,671,644 B2 | 12/2003 | Huisman et al. | |
| 6,694,454 B1* | 2/2004 | Stanley | 714/30 |
| 6,865,501 B2 | 3/2005 | Huisman et al. | |
| 6,883,115 B2 | 4/2005 | Sanada | |
| 6,998,866 B1* | 2/2006 | Bazan et al. | 324/765 |
| 7,058,869 B2 | 6/2006 | Abdel-Hafez et al. | |
| 7,134,061 B2* | 11/2006 | Agashe et al. | 714/726 |
| 7,137,053 B2* | 11/2006 | Khoche et al. | 714/726 |
| 7,139,950 B2* | 11/2006 | Huisman et al. | 714/726 |
| 7,194,706 B2 | 3/2007 | Adkisson et al. | |
| 7,234,090 B2 | 6/2007 | Blasi et al. | |
| 7,249,298 B2 | 7/2007 | Sim | |
| 7,496,816 B2* | 2/2009 | Bartenstein et al. | 714/726 |

* cited by examiner

*Primary Examiner* — James C Kerveros
(74) *Attorney, Agent, or Firm* — H. Daniel Schnurmann

(57) ABSTRACT

A structural design-for-test for diagnosing broken scan chain defects of long non-scannable register chains (GPTR) The GPTR and the system for testing and diagnosing the broken LSSD scan-only chains rapidly localize defects to the failing Shift Register Latch (SRL) pair. The GPTR modifies the latches used in the GPTR scan chain to standard LSSD L1/L2 master-slave SRL type latch pairs; connects all the system ports of the L1 latches to the Shift Register Input (SRI) and clocked by the system C1-clk while the L1 scan port is clocked by the A-clk and L2 scan port is clocked only by the B-clk. The L1 latches are connected to at least one multiplexer having a first output connected to an input of each odd SRL, and a second output connected to an input port of each even SRL. In another embodiment, the GPTR includes a plurality of multiplexers respectively coupled to the master-slave latch pairs, wherein a first set of multiplexers have their respective output attached to an input of the odd L1 latches, and a second set of the multiplexers have their respective output attached to an input port of the even L1 latches.

6 Claims, 6 Drawing Sheets

DIAGNOSABLE GENERAL PURPOSE TEST REGISTERS SCAN CHAIN DESIGN

FIELD OF THE INVENTION

The present invention relates in general to the field of testing Very Large Scale Integrated Circuit (VLSI) chips and semiconductor packages, and more particularly, to a Design for Testability and diagnostic GPTR (General Purpose Test Register) methodology, and still more particularly, to a structure and a GPTR for rapidly localizing defects to a failing or broken scan chain defects in VLSI chips.

BACKGROUND OF THE INVENTION

Testing VLSI circuit wafers has become over the years a significant part of the cost associated with the manufacturing of semiconductor products. Such testing generally entails inputting data into a logic circuit on the wafer at one or more primary inputs or testing test access point, and then reading the output results at one or more primary output terminals or output test access points.

Advances in VLSI designs has introduced radical changes in the field of testing and the diagnose of faults principally because the requirement of shipping defect free products to the customer has necessitated adding additional testing features to the design that have become part and parcel of the overall final product.

Techniques known as Design for Testability have been specifically introduced to this end. An example of such a technique is a scan design known as Level Sensitive Scan Design (LSSD) described in U.S. Pat. No. 3,761,695 to Eichelberger, which is today widely used throughout the VLSI design community.

The introduction of scan design has facilitated testing VLSI chips and integrated circuit (IC) packages by introducing linking latches and the like in scan chains memory devices scan chains, and alternating combinatorial portions of combinatorial logic between pairs of the scan chains.

The LSSD architecture incorporates several basic test concepts, such as the scan design. In such a design most of the device's storage elements, e.g., latches or registers, are concatenated in one or more scan chains and can be externally accessible via one or more serial inputs and outputs. Storage elements that are not in this category are usually memory or other special macros that are isolated and tested independently. Furthermore, this design methodology ensures that all logic feedback paths are gated by one or more of these storage elements, thereby simplifying a sequential design into subsets of combinational logic sections.

While scan chains are useful in determining whether the logic circuitry is functioning properly, the scan chains themselves may also be defective. While such defects may be from defective latches in the scan chain, if the latches are robust (designed to ensure their integrity), then defects are primarily in the wiring connecting the latches. Such defects may be open circuits (a clean break in the wiring), short circuits (a wire contacting another wire inadvertently), or stuck-at faults (the wiring touching either ground or voltage). The most problematic wiring defect is a stuck-at fault, since the latch otherwise appears to function properly, albeit with a constant input value.

Basic design concepts in conjunction with the associated system and scan clocking sequences greatly simply the test generation, testing, and diagnosability of complex logic structures. Every latch can be used as a pseudo Primary Input (PI) and as a pseudo-Primary Output (PO) in addition to the standard PIs and POs to enhance the stimulation and observability of the device being tested or diagnosed. LSSD latches are typically implemented in a L1/L2 configuration where the L1 or master latch has two data ports and may be updated be either a scan clock or a functional clock. The L2 or slave latch has only one clock input and that clock is out-of-phase with both L1 clocks. Scanning is performed using separate A and B clocks.

Of particular importance to the field of testing is a technique known as Self-Test, whereby a set of reproducible random binary test vectors are generated, thereby allowing creating testing means applicable to any chip, multi-chip modules, up to a system level, without requiring heavy expenditures of CPU time. Two basic components of a LBIST (Logic Built-in Self-Test) structure are a Liner Feedback Shift Register (LFSR) and a Multiple Input Signature Register (MISR). The LFSR serves as a pseudo random pattern generator that provides the stimuli for the logic to be tested, while the MISR is utilized to generate a unique signature representing the responses from the logic. Ideally the signature for each failing device is different from the signature of a good device after a predefined number of test cycles.

The configuration of the scan chain in the LBIST test mode is partitioned into several sub-chains of approximately the same length as described in U.S. Pat. No. 5,150,366 to Bardell et al. These chains are loaded and unloaded serially for each LBIST test. Once in LBIST mode, the scan chain is reconfigured into a number of parallel sub-chains. The pseudo random data loaded in parallel into each sub-chain is supplied by the LFSR and used as test stimuli. Similarly, the state of all the latches in the sub-chains is unloaded serially into the MISR forming a signature representing the compressed data.

Each LBIST test cycle, in addition to the loading and unloading of the sub-chains, requires timed application of system clocks to launch the test vector from these latches through the combinational logic and capture the resulting response in the receiving latches. Since a typical system design may consist of several system clocks and various path delays, the clock test sequence and timing set-up may be applied multiple times with different clock combinations and timings. Typically, this is accomplished by an on-product clock generation (OPCG) function and LBIST control.

An LBIST test interval in turn consists of a relatively large number of these load/unload sequences followed by the system clock cycle. At the end of the interval, the MISR contents or signature is unloaded and compared to an expected signature. Several signature intervals may be applied to achieve the desire test coverage.

This LBIST methodology is an effective Design for Test (DFT) that can support structural test from the chip level, various package levels, up to the system level. Some of the benefits associated with this approach include relatively low test data volumes, minimal VLSI test system requirements, at-speed test rates, and extendibility to system test.

The GPTR chain has been getting longer with each server design version. Currently, some of the chains have 1000+ SRLs. GPTR scan chains are expected to become significantly longer as multiple cores and additional arrays on the chip are added. The scan-only GPTR latches perform multiple functions, such as dynamic configurability, redundancy and repair, timing and performance optimization, test and debug "chicken switches", and many other future design options.

Although the current GPTR chains represent a relatively small percentage of the total latches on the chip, their impact do diagnosability is more severe. In a stuck-at GPTR chain, the configurability of the chip is questionable and, in most cases, diagnosing most other problems on the chip becomes difficult and time consuming. In cases where the GPTR chain causes a very low or zero yield for the product, the diagnosability becomes a severe problem.

For illustrative purposes, and with reference to FIG. 1, there is depicted a prior art GPTR scan chain 100 including a chain of shift Register Latches (SRL), SRL1-SRLN, each including a master latch L1 (102) and a slave latch L2 (104). The master latch L1 (102) has a pair of data ports SCAN and DATA that may be captured by the latch responsive to a scan clock A-CLK. The slave latch L2 (104) captures the value stored in the master latch L1 (102) responsive to a second scan clock B-CLK.

Generally, the major drawback of the scan based design test methodology is encountered when a scan chain does not function properly which reduces the access to the internal logic of the device, severely complicating the diagnostic process and inhibiting rapid determination of the problem's root cause. In low or zero yield situations, the most common failure is often caused by the scan chain. Since the design requires a scan based design, it is found that the scan chains occupy a significant portion of the real estate area. Having a solution that speeds the 'stuck-at' scan chain diagnostics on failing chips results in timely yield improvements and, consequently, ensuring a successful production of the design.

The broken or stuck-at scan chain problem is even more severe when it occurs in scan chains that are used to control the test modes and configuration of the remaining latches on the device. In these situations, the diagnosis of the problem is necessary to identify and rapidly resolve catastrophic zero yield or design problems.

Additionally, these type of problems are usually encountered early in the technology's life cycle and diagnosing them is critical in improving the process so it quickly achieves manufacturing yield levels. The inability to improve the technology and yield of the device can greatly impact a program or at least severely minimize the revenue that could be realized. Rapid diagnosis to a location for Physical Failure Analysis (PFA) is needed to understand and correct the process anomalies.

A common approach to diagnose "broken" or stuck-at scan chains is to use the system port to switch the latches down stream from the "break" and than unload the scan chain and determine the last latch position that switches to the complement state of the stuck-at state. Of course, one needs to provide the proper logic state to the system port input of the latch. Furthermore, to get an accurate diagnostic call for the stuck latch, one needs to provide the proper logic input to the next latch downstream to the stuck-at latch, otherwise only an approximate latch diagnostic location can be determined.

Thus, there is a need for a GPTR and a system capable of diagnosing broken scan chain defects of long non-scannable register chains (GPTR), primarily those exceeding 10K latches).

OBJECTS AND SUMMARY OF THE INVENTION

Accordingly, it is a primary object of the invention to provide a structure and a GPTR for rapidly localizing defects in a failing or broken scan chain in GPTRs without requiring diagnostic test pattern generation.

It is another object to utilize standard LSSD latches with negligible impact to area and power and no impact on the functionality nor the performance.

It is still another object to achieve a high diagnostic accuracy to detect the failing latch in the GPTR scan chain.

It is a further object to have the L2 latch maintain its configuration state during system operation while the system clock is operational.

It is yet a further object to achieve the above objects without requiring diagnostic pattern generation.

The above, as well as additional objectives, features, and advantages of the present invention will become apparent in the following detailed written description.

The present invention is directed to a structural design-for-test and diagnostic GPTR for diagnosing broken scan chain defects of long non-scannable register chains (GPTR) The GPTR and system for testing and diagnosing the broken LSSD scan-only chains rapidly localize defects to the failing Shift Register Latch (SRL). The diagnostic GPTR modifies the latches used in the GPTR scan chain to standard LSSD L1/L2 master-slave SRL type latch pairs; connects all the system ports of the L1 latches to the Shift Register Input (SRI) and clocked by the system C1-clk and while the L1 scan port is clocked by the A-clk and L2 scan port is clocked only by the B-clk.

In one aspect of the invention, there is provided a novel structure design for test and diagnostic GPTR that addresses problems associated with scan-only chains consisting of LSSD latches that typically do not have a broadside system port input, such as used in General Purpose Test Registers (GPTRs). It further solves the problem of diagnosing broken scan chain defects for a non-scannable register chains (GPTR), rapidly localizing defects in a failing Shift Register Latch (SRL).

In another aspect of the invention, there is provided a way to broadside stimulate the latches in the chain during the diagnostic test. LSSD deterministic patterns, internally generated LBIST stimuli, look-ahead scan diagnostic patterns, dynamically scrambled patterns are some of the techniques used to provide these stimuli. The diagnostic approach described works successfully in most cases where latches have system ports, but are ineffective when the latches in the scan chain are "scan-only" type latches, such as used in GPTR scan chains.

A preferred solution to the problem modifies the latches used in the GPTR scan chain to standard LSSD L1/L2 master-slave SRL type latch pairs. All the L1 latches have the system port attached to the Shift Register Input (SRI) and clocked by the system C1-clk, while the L1 scan port is clocked by the A-clk and L2 scan port is clocked only by the B-clk.

In still another aspect of the invention, there is provided a general purpose test registers scan chain (GPTR) formed by a plurality of interconnected latch pairs (SRL), each pair consisting of a master latch (L1) and a slave latch (L2), the GPTR including at least one multiplexer having a first output connected to an input of each odd SRL, and a second output connected to an input port of each even SRL.

In still another aspect, there is provided a general purpose test registers scan chain (GPTR) formed by a plurality of interconnected master-slave latch pairs (SRL), each pair consisting of a master latch (L1) and a slave latch (L2), the GPTR including a plurality of multiplexers respectively coupled to the master-slave latch pairs, wherein a first set of the plurality of multiplexers have their respective output attached to an input of the odd L1 latches, and a second set of the plurality of multiplexers have their respective output attached to an input port of the even L1 latches.

In yet another aspect of the invention, there is provided a method of testing and detecting a defect in a general purpose test registers scan chain (GPTR) formed by a plurality of interconnected pairs (SRL) latches, each consisting of master latches (L1) and slave latches (L2), the method including multiplexing a first set formed by the odd SRL pairs and a second set formed by the even SRL pairs; identifying the defective SRL by data following the defective SRL being either stuck-at-0 or stuck-at-1; scanning-out the data stored in the defective SRL; and comparing the scanned-out data against expected data.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION

Figure 2:
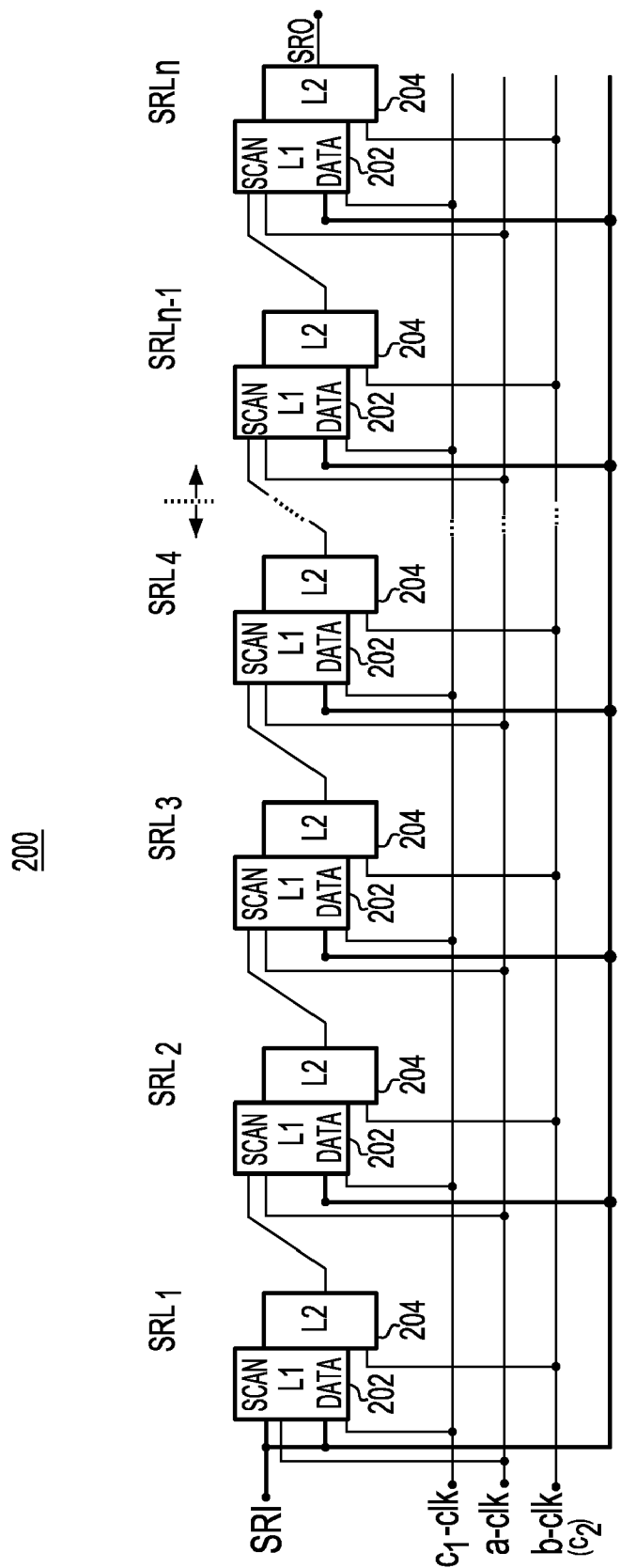
FIG. 2 shows a basic Shift Register Input (SRI) diagnosable GPTR Scan Chain according to one aspect of the invention.

Referring to FIG. 2, there is shown an SRI GPTR scan chain 200 including a chain of shift Register Latches (SRL), SRL1-SRLN, each including a master latch L1 202 and a slave latch L2 204. The master latch L1 202 has a pair of data ports SCAN and DATA, that may be captured by the latch responsive to a first scan clock A-CLK or a first functional system clock C1-CLK. All the L1 202 latches system port attached to the Shift Register Input (SRI). The slave latch L2 204 captures the value stored in the master latch L1 202 responsive to either a second scan clock B-CLK or a second functional system clock C2 CLK. The second scan clock B-CLK and the second functional system clock C2 CLK are combined as a single clock signal B/C2-CLK. The second scan clock B-CLK and the second functional system clock C2-CLK are typically driven out of phase with both the first scan clock A-CLK and the first functional clock C1-CLK applied to the master latch L1 202.

Figure 3:
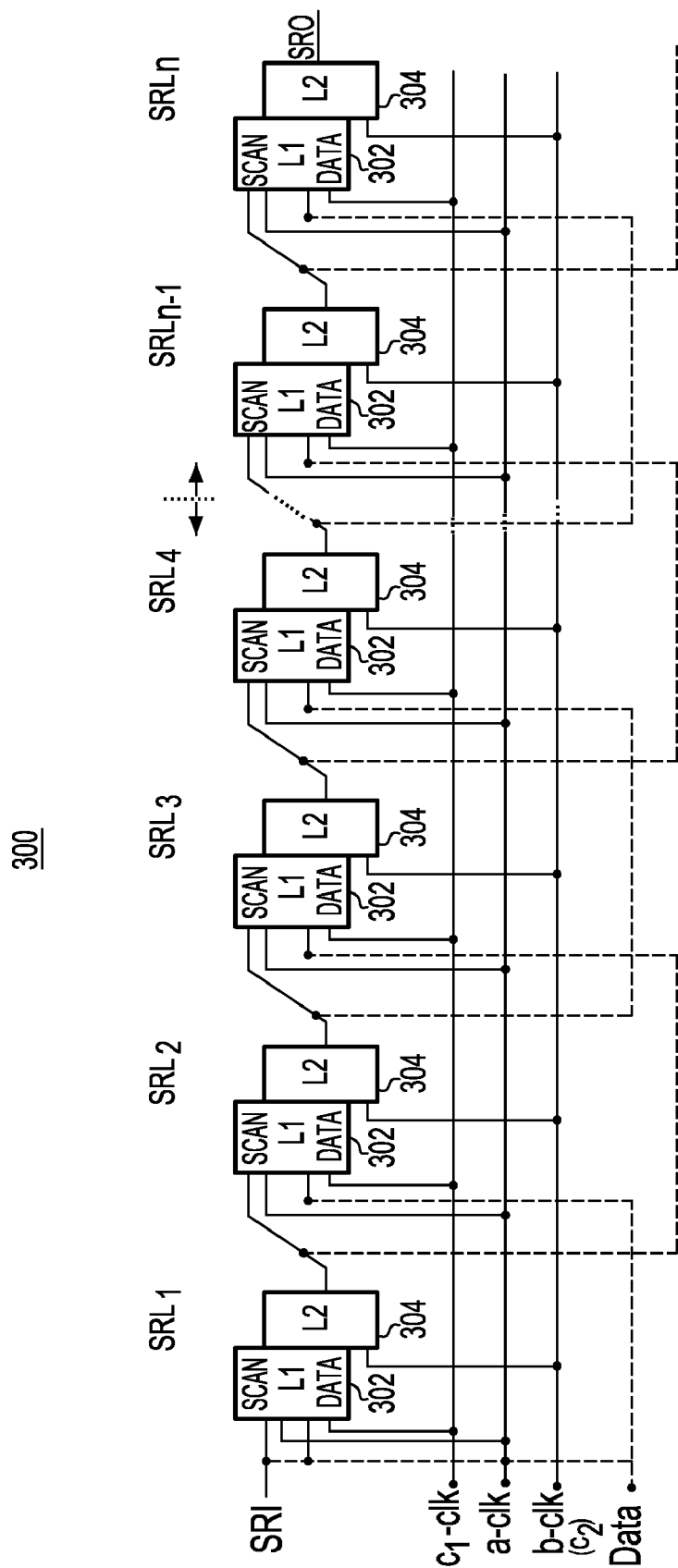
FIG. 3 shows an alternate latch SRI diagnosable GPTR Scan Chain according to the invention.

FIG. 3 illustrates an alternate latch SRI GPTR scan chain 300 including a chain of shift Register Latches (SRL), SRL1-SRLN, each including a master latch L1 302 and a slave latch L2 304. The master latch L1 302 has a pair of data ports SCAN and DATA, that may be captured by the latch responsive to a first scan clock A-CLK or a first functional system clock C1-CLK. But instead of having all the L1 302 latches system port attached to the Shift Register Input (SRI), the output of each odd SRL L2 304 latch is attached to the system port of the next downstream odd SRL L1 302 latch. Similarly, each output of the even SRL L2 304 latch is attached to the system port of the next downstream even SRL L1 302 latch. The clocked by the system C1-CLK, while the L1 scan port is clocked by the A-CLK and L2 scan port is clocked by the B-CLK. As shown in FIG. 3

Figure 1:
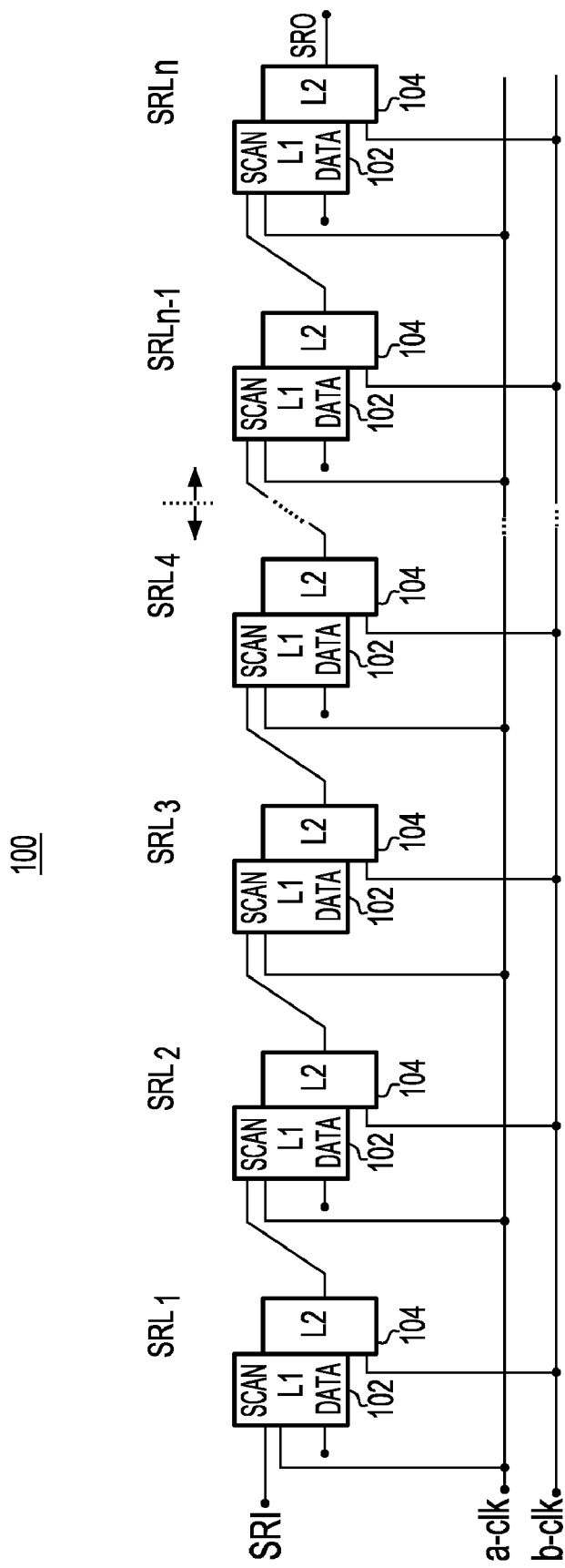
FIG. 1 illustrates a prior art GPTR scan chain consisting of a chain of shift Register Latches (SRL), SRL1-SRLN, each including a master latch L1, 102 and a slave latch L2.

The basic concept consists of exercising the standard LSSD L1/L2 master-slave SRL type latch pairs to be used as the broken scan chain diagnostic patterns. FIG. 1 shown the typical GPTR scan chain configuration with the L1 and L2 latch are attached to the A-clk and B-clk. After the scan-in load operation is performed, Then, system C1 and C2 clocks are applied. as shown in FIG. 2. When pulsing the system C1 clock, the system data is clocked in broadside manner through the system ports of the latches forming the scan chain(s). Subsequently, the scan chain(s) are then unloaded and the scan chain internal states are analyzed by tester resident software that identifies the latch at which the data stops and the stuck-at-0 or stuck-at-1 data begin. The DC broken SRL is then identified as the first SRL where all the data after that point is either stuck-at-0 or stuck-at-1. The first bit in the string of the stuck-at-0 or stuck-at-1 outputs may not be where the problem resides. Some string of 0's or 1's may be expected in the latches prior to the stuck latch by a combination of logic/array design and power-up conditions. This unload data can also be compared against a "good" known reference device's unload data (if available) to help narrow down or localize where the fault occurs and thus, will greatly improve the accuracy of the diagnostic call.

Figure 4:
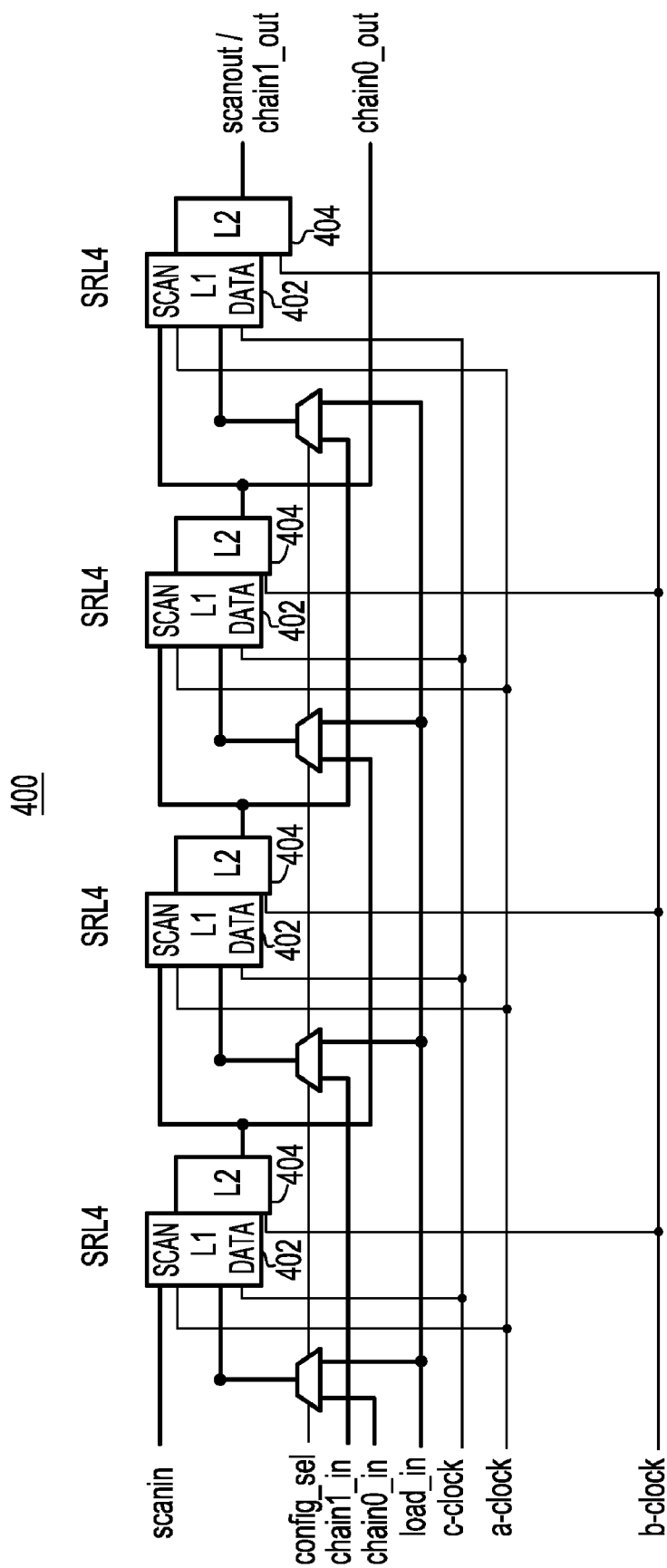
FIG. 4 illustrates a preferred embodiment of the diagnosable GPTR Scan Chain in accordance to the present invention.

FIG. 4 shows an embodiment that allows diagnosis of two types of scan chain defects using a single design. The embodiment provides two different structures to be used during the "broadside load" of data using the C CLK. Shown in FIG. 4 is a preferred embodiment of a diagnosable GPTR scan chain 400 including a chain of shift Register Latches (SRL), SRL1-SRLN, each including a master latch L1, 402 and a slave latch L2, 404. The master latch L1, 402 has a pair of data ports SCAN and DATA, that may be captured by the latch responsive to a first scan clock A-CLK or a first functional system clock C1-CLK.

The first defect type is reflected by the failure to pass data through a particular latch in the scan chain. This defect does not necessarily manifest itself as a pure "stuck at" type fault. This defect can be isolated by using the "config_sel" control signal to select "chain0" and "chain1" for the broadside-load configuration. This particular configuration allows neighboring latches in the scan chain to be "broadside-loaded" with different data. Data is then be scanned out, and the point of failure, relative to the "scan-out" pin and is reflected in the scanned out data.

The second defect type to be reflected in the failure of a particular latch, such that the failing latch's output is "stuck at 0" or "stuck at 1". This defect type is isolated to a particular latch by using the "config_sel" to select the "load_in" for the broadside-load configuration. This particular configuration allows all latches in the scan chain to be "broadside-loaded" with the same data. For detecting a "stuck at 0" in the scan chain, a "1" would be "broadside-loaded" into all latches, and the scanned out data is reflect the location, relative to the scan-out pin, of the "stuck at 0" latch. For detecting a "stuck at 1" in the scan chain, a "0" is "broadside-loaded" into all latches, and the scanned out data reflects the location, relative to the scan-out pin, of the "stuck at 1" latch.

Figure 5:
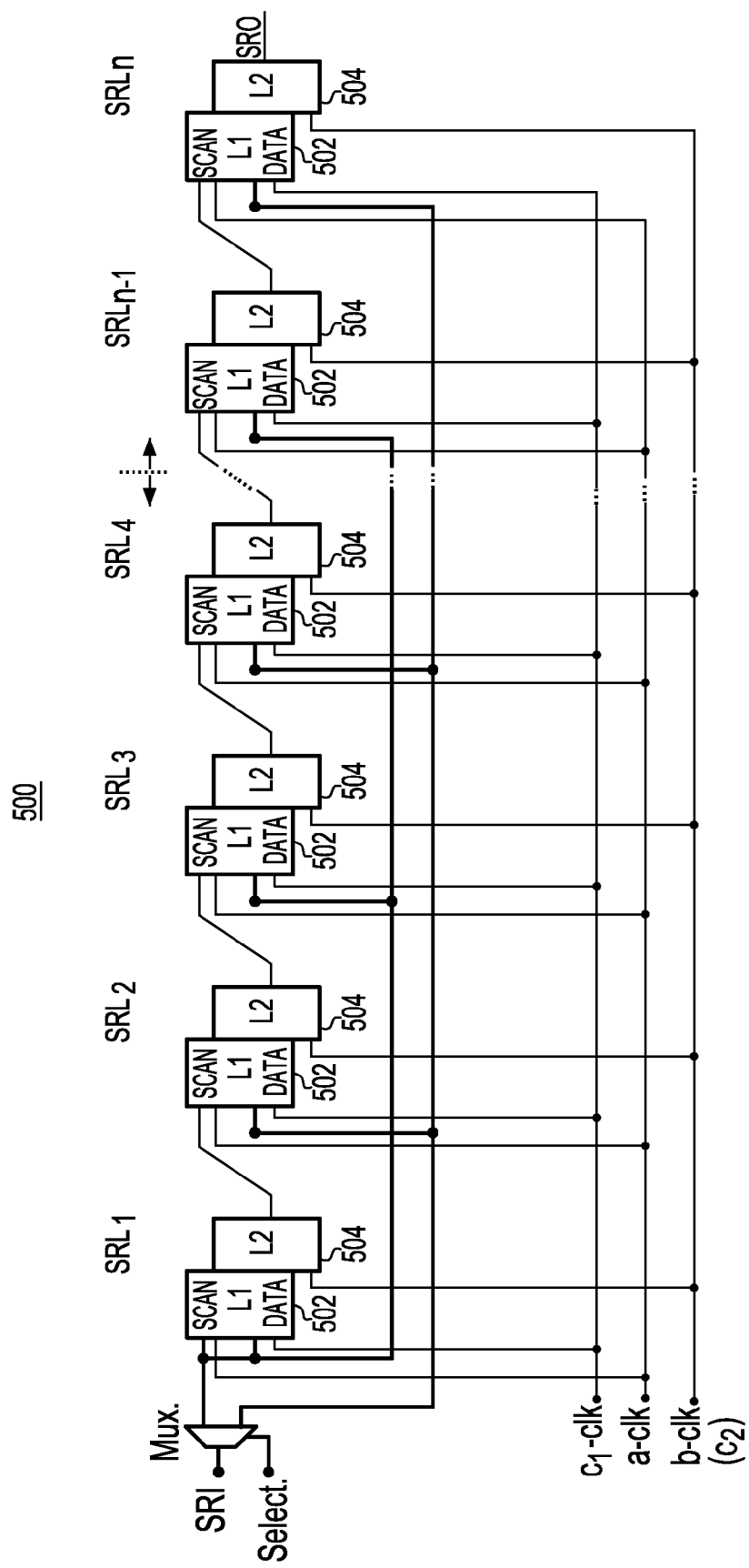
FIG. 5 shows the SRI to be shared by two sub-chains allowing for additional control when loading the broadside data to adjacent latches.

Referring now to FIG. 5, there is a multiplexed SRI diagnosable GPTR Scan Chain illustrated in accordance with the present invention. The embodiment shown therein allows for the SRI to be shared for two sub-chains making it possible to provide additional control in loading the broadside data to adjacent latches.

A multiplexed (mux'd) SRI GPTR scan chain 500 is illustrated including a chain of shift Register Latches (SRL), SRL1-SRLN, each including a master latch L1, 502 and a slave latch L2, 504. The master latch L1, 502 has a pair of data ports SCAN and DATA, that may be captured by the latch responsive to a first scan clock A-CLK or a first functional system clock C1-CLK.

There are two different approaches of collecting the "good" unload latch values can be used in this diagnostic process.

The latch values are generated prior to test via a good machine simulator (GMS) and stored on the tester or system. This may require relatively large signature storage capacity on the tester, but need to be performed only once.

The second approach, very powerful in some situations, is to use the same device under test to generate the "good" reference latch values. This can be accomplished when the device has an operating range that is functioning properly. This operating range might be at a slightly different voltage or timing conditions.

An alternate embodiment of the present invention is to similarly modify the latches used in the GPTR scan chain to standard LSSD L1/L2 master-slave SRL type latch pairs, But instead of having all the L1 latches' system port attached to the Shift Register Input (SRI), the output of each odd SRL L2 latch is attached to the system port of the next downstream odd SRL L1 latch. Similarly, each output of the even SRL L2 latch is attached to the system port of the next downstream even SRL L1 latch. The clocked by the system C1-clk, while the L1 scan port is clocked by the A-clk and L2 scan port is clocked only by the B-clk. as shown previously, with reference to FIG. 3.

The advantage of the alternate embodiment is that one does not need to distribute the SRI signal to all the L1 latches in the GRTR chain. This may be a consideration when the GPTR scan chin is relatively long, e.g. more than a thousand latches or so. Alternatively, a disadvantage of the alternate GPTR is that it adds an additional fan-out to the L2 latch, which may have a minor impact to performance. Also, the diagnostic sequence is somewhat simpler when using the SRI signal to sensitize each latch prior to scan out.

Figure 6:
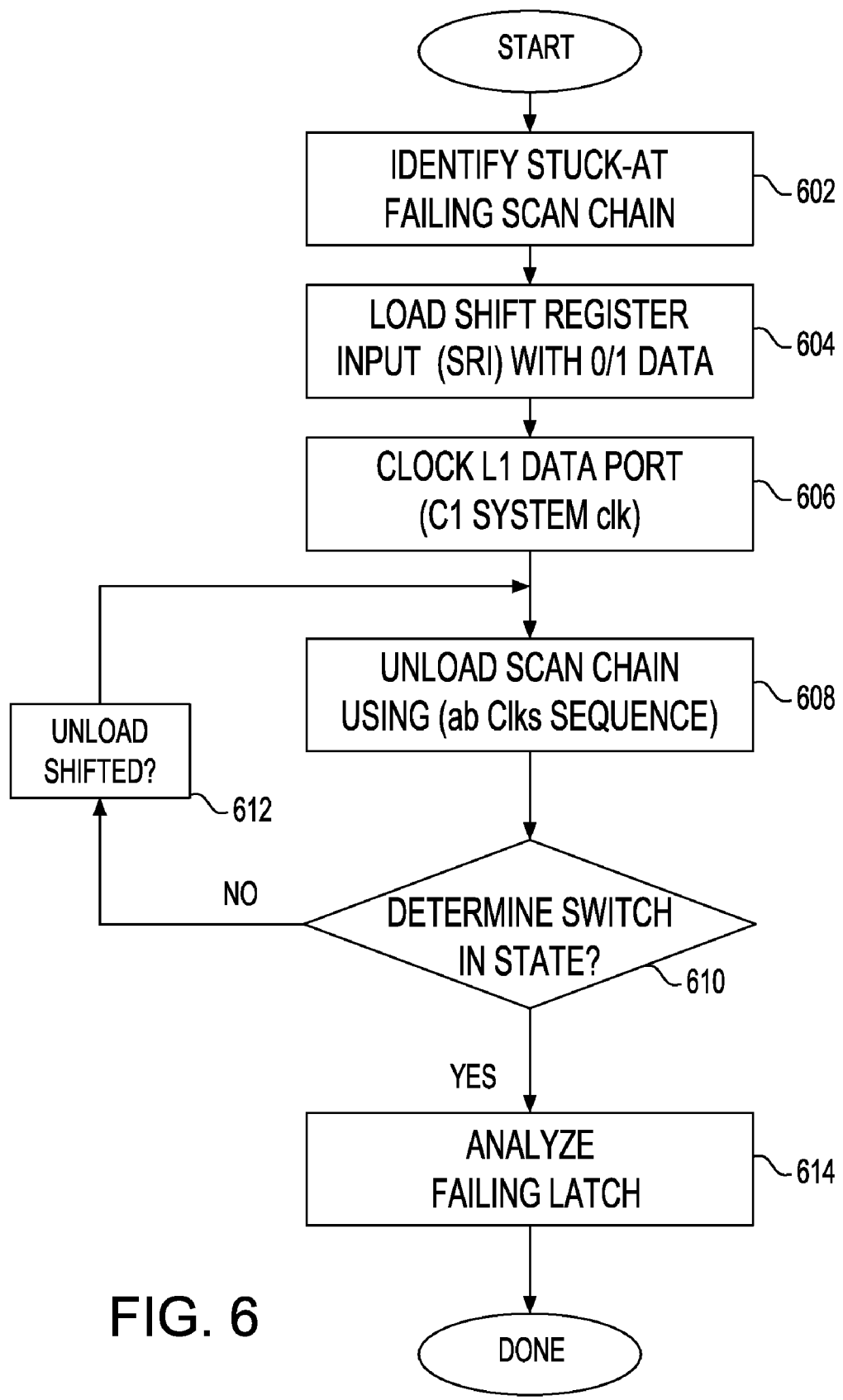
FIG. 6 is a flow chart illustrating a basic scan chain diagnostic process as it applies to the GPTR illustrated in FIG. 2.

Referring now to FIG. 6, there is shown a basic flow chart of the GPTR scan chain diagnostic process.

Block 602 shows a failing scan chain which is identified based on a manufacturing data collection, such that the failing latch output would be stuck-at-0 or stuck-at-1. In step 604, the Shift Register Input (SRI) is loaded with "0/1" data.

Referring to Block 606, upon pulsing the system clock (C1), system data is clocked broadside via the system ports of the latch within the scan chains.

Subsequently, in Block 608, the scan chains are then unloaded using clocks A and B followed by decision block 610, where checking for the latch switching states. If the latch switching state is not completed, the system branches back to block 608 to repeat the unload scan chain process until the scan chains have all shifted (Block 612).

Once the step of determining the states of each latch forming the scan chain is completed, the data results are analyzed to identify the shift register latch (SRL) pair at which the random stops and the stuck-at-0 or stuck-at-1 data is initiated, as shown in block 614. Having detected which shift register latch pair fails, the defective chip is then passed on to Physical Failure Analysis to determine the cause of the failure.

Finally, the method of testing and detecting defects in a scan chain can also be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The method of testing and diagnosing the presence of defects can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A scan chain formed by a plurality of interconnected scan latch pairs, each pair consisting of a master latch (L1) and a slave latch (L2), and each pair alternating between odd and even pair, the scan chain comprising:
    a first set of a plurality of multiplexers and a second set of a plurality of multiplexers, each multiplexer of said first set of the plurality of multiplexers being respectively attached to each even pair of said scan chain, and
    each multiplexer of said second set of the plurality of multiplexers being respectively attached to each odd pair of said scan chain.

2. The scan chain as recited in claim 1, wherein each master latch (L1) is driven by an A-clock and by a system clock ($C_1$) and each slave latch (L2) is driven by a B-clock.

3. The scan chain as recited in claim 2, wherein the scan latches are broadside loaded by pulsing the system clock (C1).

4. The scan chain as recited in claim 1, wherein said at least one multiplexer has the first output connected to a scan-in port and to a data port of the respective L1 latches of each odd pair, and the second output connected to the data port of the respective L1 latches of each even pair.

5. The scan chain as recited in claim 1, wherein a first input of the at least one multiplexer is connected to a Shift Register Input (SRI) and a second input is attached to a select input port.

6. The scan chain as recited in claim 1, wherein the first output of the at least one multiplexer is connected to a scan port and to a data port of the L1 latch of the first pair.

* * * * *